(12) United States Patent
Yen et al.

(10) Patent No.: US 10,510,954 B2
(45) Date of Patent: Dec. 17, 2019

(54) PHASE CHANGE RANDOM ACCESS MEMORY DEVICE

(71) Applicant: Taiwan Semiconductor Manufacturing Co., Ltd., Hsinchu (TW)

(72) Inventors: Chun-Hsu Yen, Hsinchu (TW); Yu-Chuan Hsu, Hsinchu (TW); Chen-Hui Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/904,064

(22) Filed: Feb. 23, 2018

(65) Prior Publication Data

US 2019/0165265 A1 May 30, 2019

Related U.S. Application Data

(60) Provisional application No. 62/591,318, filed on Nov. 28, 2017.

(51) Int. Cl.
*H01L 45/00* (2006.01)
*H01L 27/24* (2006.01)
*G11C 13/00* (2006.01)

(52) U.S. Cl.
CPC ........ *H01L 45/126* (2013.01); *H01L 27/2436* (2013.01); *H01L 45/06* (2013.01); *H01L 45/124* (2013.01); *H01L 45/143* (2013.01); *H01L 45/144* (2013.01); *H01L 45/148* (2013.01); *H01L 45/16* (2013.01); *H01L 45/1675* (2013.01); *G11C 13/0004* (2013.01); *H01L 45/1233* (2013.01)

(58) Field of Classification Search
CPC ..... H01L 45/126; H01L 45/06; H01L 45/124; H01L 45/16; H01L 27/2436; H01L 45/1233; G11C 13/0004
See application file for complete search history.

(56) References Cited

U.S. PATENT DOCUMENTS

| 2005/0024933 A1 | 2/2005 | Pellizzer et al. |
| 2007/0063180 A1 | 3/2007 | Asano et al. |
| 2014/0042382 A1 | 2/2014 | Lung |

(Continued)

FOREIGN PATENT DOCUMENTS

| DE | 60306893 T2 | 2/2007 |
| DE | 102006041849 A1 | 4/2007 |

OTHER PUBLICATIONS

Official Action dated Oct. 15, 2018, in corresponding German Patent Application No. 10 2018 106 052.1.

*Primary Examiner* — Patricia D Reddington
(74) *Attorney, Agent, or Firm* — Duane Morris LLP

(57) ABSTRACT

A memory device includes: a first conductive column structure extending through a first dielectric layer, wherein the first conductive column structure comprises a shell portion wrapping a core structure filled with a dielectric material and an end portion that is coupled to one end of the shell portion and disposed below the core structure; and a first phase change material layer formed over the first dielectric layer, wherein a lower boundary of the first phase change material layer contacts at least a first portion of the other end of the shell portion of the first conductive column structure.

17 Claims, 19 Drawing Sheets

(56) References Cited

U.S. PATENT DOCUMENTS

| | | | |
|---|---|---|---|
| 2014/0151628 A1 | 6/2014 | Li et al. | |
| 2014/0183434 A1* | 7/2014 | Lim | H01L 27/2463 257/4 |
| 2016/0104841 A1* | 4/2016 | Ahn | H01L 45/1683 438/382 |
| 2018/0019281 A1* | 1/2018 | Lee | H01L 27/2427 |

* cited by examiner

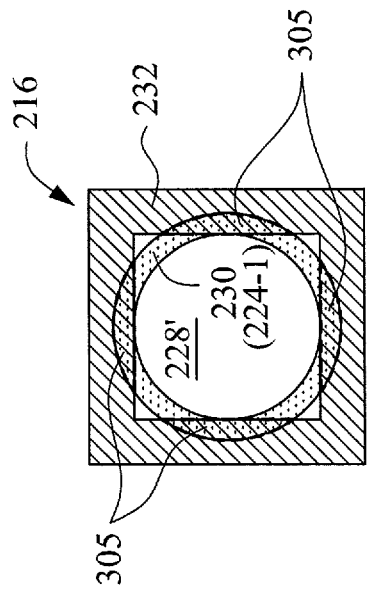
Fig. 3A
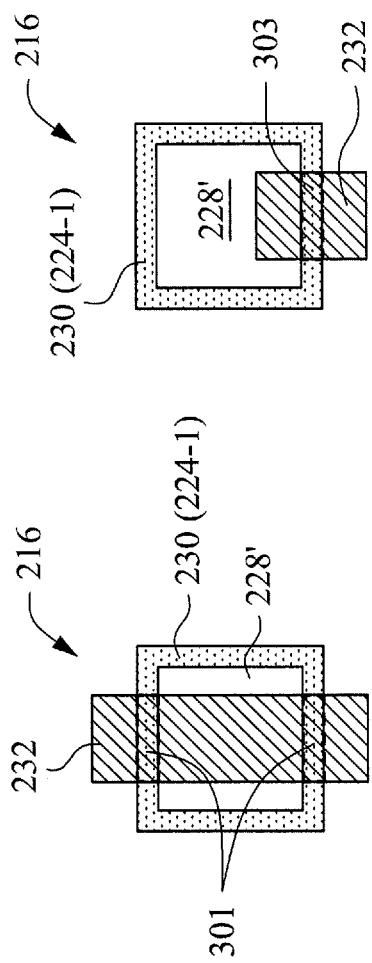
Fig. 3B
Fig. 3C
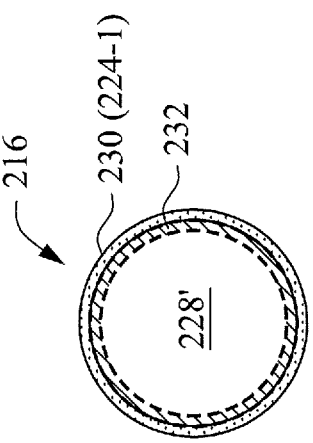
Fig. 3D

PHASE CHANGE RANDOM ACCESS MEMORY DEVICE

CROSS-REFERENCE TO RELATED APPLICATION

The present application claims priority to U.S. Provisional Patent Application No. 62/591,318, filed on Nov. 28, 2018, which is incorporated by reference herein in its entirety.

BACKGROUND

In recent years, unconventional nonvolatile memory (NVM) devices, such as ferroelectric random access memory (FRAM) devices, resistive random access memory (RRAM) devices, and phase change random access memory (PCRAM) devices have emerged. In particular, PCRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

Generally, a PCRAM device includes a top electrode (e.g., an anode) and a bottom electrode (e.g., a cathode) with a phase change material layer interposed therebetween. Further, the bottom electrode is coupled to the phase change material layer with a conductive structure, typically knows as a "heater" structure. To transition the PCRAM device to the low resistance state, which is typically referred to as a set operation, a relatively low electrical current signal is applied on the phase change material layer through the heater structure to anneal the phase change material layer at a temperature between respective crystallization (lower) and melting (higher) temperatures of the phase change material layer so as to crystallize the phase change material layer; and to transition the PCRAM device to the high resistance state, which is typically referred to as a reset operation, a relatively high electrical current signal is applied on the phase change material layer via the heater structure to anneal the phase change material layer at a temperature higher than the melting (higher) temperature of the phase change material layer so as to amorphorize the phase change material layer. In particular, a current level of the applied electrical current signal that can successfully amorphorize/crystallize the phase change material layer is proportional to a contact area size at an interface between the heater structure and the phase change material layer. For example, the bigger the contact area size is, the higher the current level of the applied electrical current signal needs to be.

The heater structures of existing PCRAM devices, however, couple respective phase change material layers with relatively large contact areas, which disadvantageously requires respective current levels to be relatively high. Various issues may accordingly occur in exiting PCRAM devices when applying such a high current level signal, for example, less reliability, higher power consumption, etc. Thus, existing PCRAM devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 3A, 3B, 3C, 3D, 3E, and 3F illustrate respective plan views of various embodiments of part of the exemplary semiconductor device made by the method of FIG. 1, in accordance with some embodiments.

DETAILED DESCRIPTION OF EXEMPLARY EMBODIMENTS

Figure 1A:
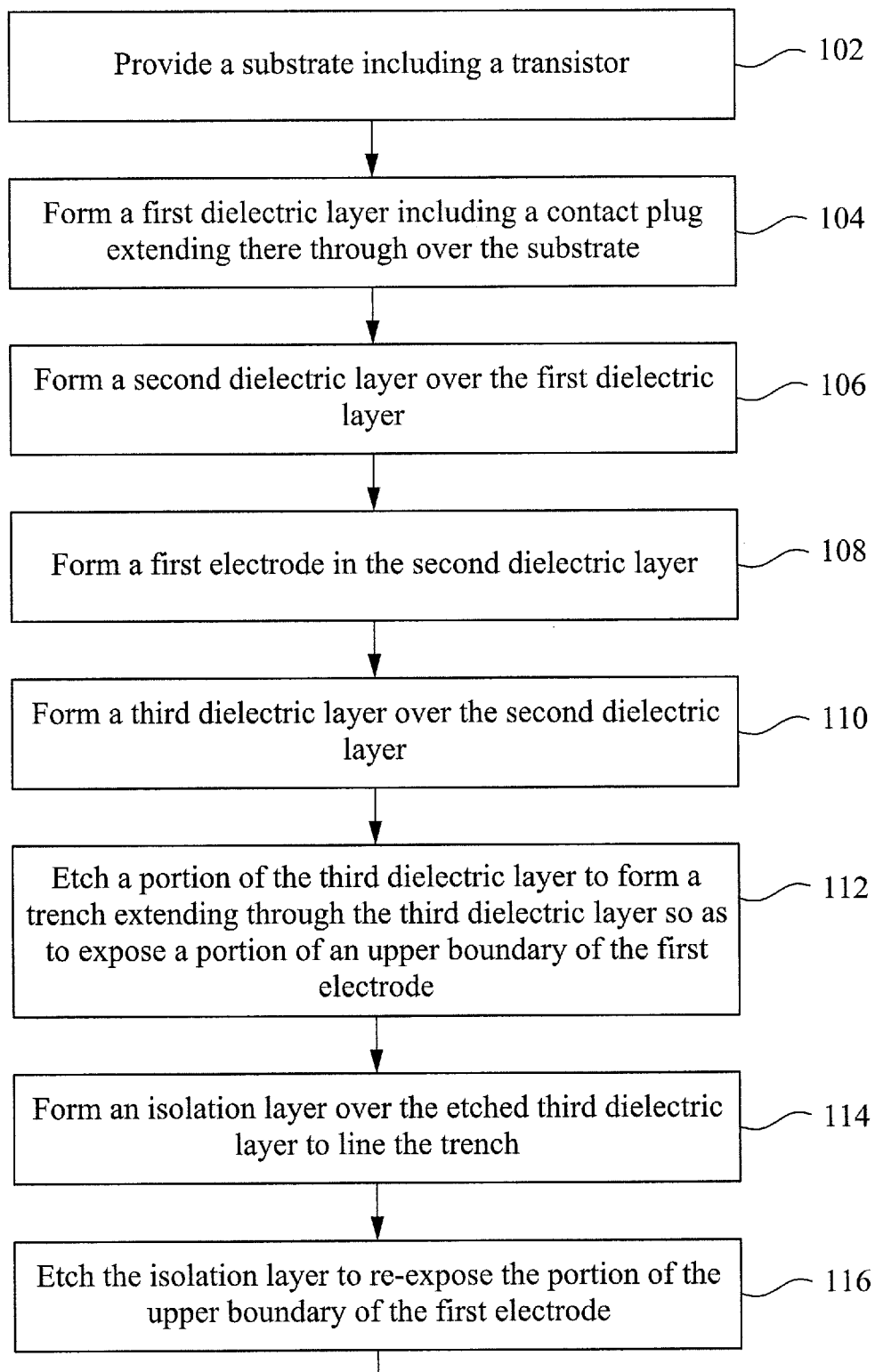
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel PCRAM (phase change random access memory) device and methods to form the same. In some embodiments, the disclosed PCRAM device includes a bottom electrode, a bottom conductive column structure, a phase change material layer, an optional top conductive column structure, and a top electrode, wherein the bottom and top conductive column structures each includes a sidewall portion formed as a "shell" structure surrounding a "core" structure formed of a dielectric material. Specifically, the bottom electrode is coupled to the phase change material layer through the sidewall portion of the bottom conductive column structure, and the top electrode is coupled to the phase change material layer through the top conductive column structure. In some embodiments, the bottom and top conductive column structures may be each configured to conduct a current signal to the phase change material layer. Since the sidewall portion of the bottom conductive column structure is formed as the shell structure, a corresponding contact area size at the interface between the phase change material layer and the bottom conductive column structure can be significantly reduced when compared to the conventional PCRAM devices. As such, various issues that the conventional PCRAM devices encounter can be advantageously avoided in disclosed PCRAM devices.

Figure 1B:
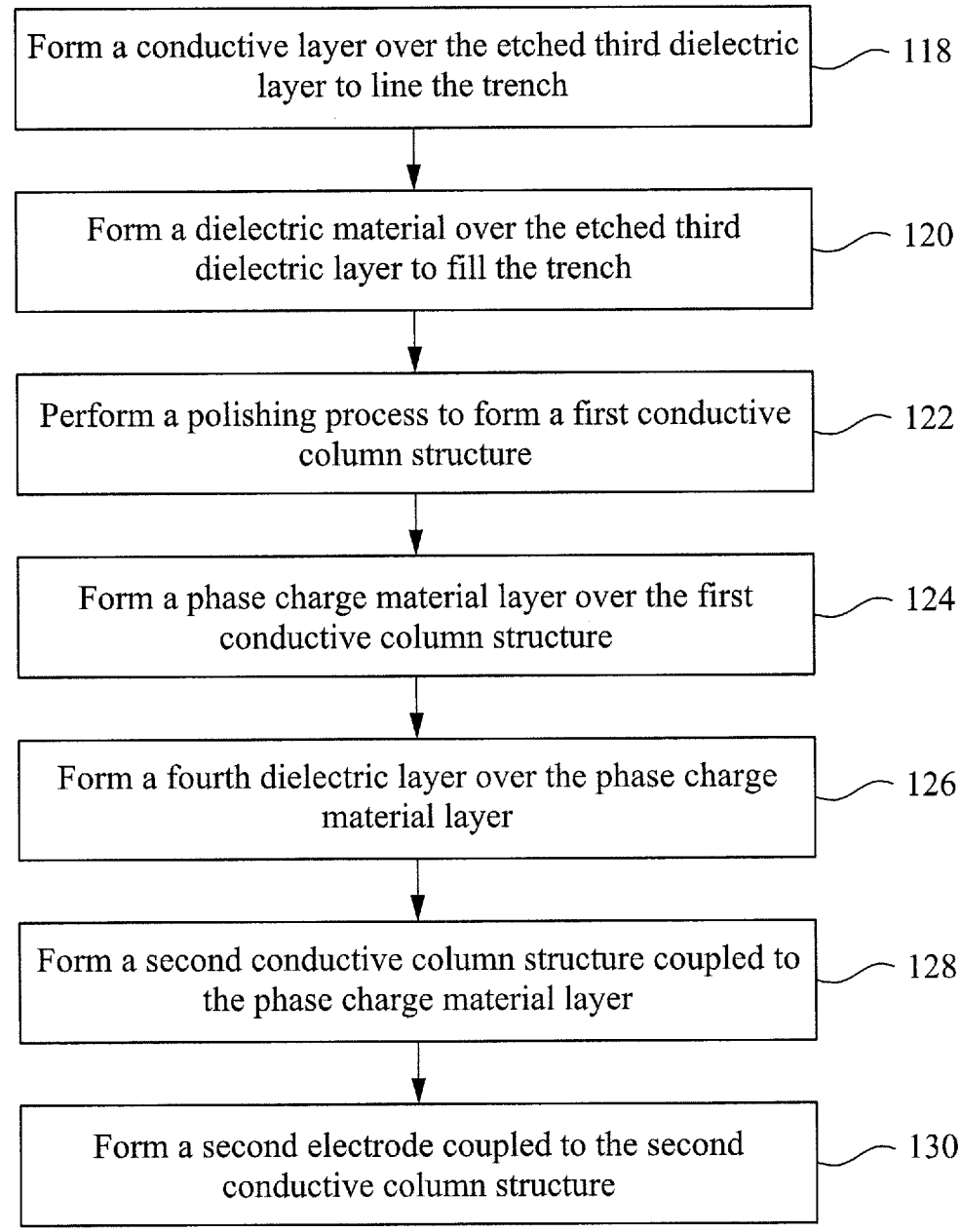

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a PCRAM device. As employed by the present disclosure, the PCRAM device refers to any device including a phase change material layer. It is noted that the method 100 of FIGS. 1A and 1B does not produce a completed PCRAM device. A completed PCRAM device may be fabricated using complementary metal-oxide-semiconductor (CMOS) technology processing. Accordingly, it is understood that additional operations may be provided before, during, and after the method 100 of FIGS. 1A and 1B, and that some other operations may only be briefly described herein. In some other embodiments, the method may be used to form any of a variety of nonvolatile memory (NVM) devices, such as ferroelectric random access memory (FRAM) devices, resistive random access memory (RRAM) devices, etc., while remaining within the scope of the present disclosure.

Referring first to FIG. 1A, in some embodiments, the method 100 starts with operation 102 in which a substrate including a transistor is provided. The method 100 continues to operation 104 in which a first dielectric layer including a contact plug extending therethrough is formed over the substrate. In some embodiments, the first dielectric layer is formed over the transistor, and the contact plug is electrically coupled to at least one conductive feature (e.g., a drain, source, or a gate feature) of the transistor. The method 100 continues to operation 106 in which a second dielectric layer is formed over the first dielectric layer. The method 100 continues to operation 108 in which a first electrode is formed in the second dielectric layer. In some embodiments, the first electrode is electrically coupled to the contact plug extending through the first dielectric layer. The method 100 continues to operation 110 in which a third dielectric layer is formed over the second dielectric layer.

Next, the method 100 continues to operation 112 in which a portion of the third dielectric layer is etched to form a trench extending through the third dielectric layer so as to expose a portion of an upper boundary of the first electrode. The method 100 continues to operation 114 in which an isolation layer is formed over the etched third dielectric layer to line the trench. As such, the isolation layer extends along sidewalls of the trench and overlays a bottom boundary of the trench (i.e., the portion of the upper boundary of the first electrode that was exposed in operation 112). It is noted that in some embodiments, the isolation layer may also overlay an upper boundary of the third dielectric layer. The method 100 continues to operation 116 in which a portion the isolation layer is etched to re-expose the portion of the upper boundary of the first electrode. In some embodiments, concurrently with the exposure of the portion of the upper boundary of the first electrode, another portion of the isolation that overlays the upper boundary of the third dielectric layer is also etched away.

Referring then to FIG. 1B, the method 100 continues to operation 118 in which a conductive layer is formed over the etched third dielectric layer to line the trench. Specifically, in some embodiments, the conductive layer is formed to overlay the re-exposed portion of the upper boundary of the first electrode, extend along sidewalls of the trench (with the isolation layer coupled therebetween), and overlays the upper boundary of the third dielectric layer. The method 100 continues to operation 120 in which a dielectric material is formed over the etched third dielectric layer to fill the trench. Specifically, in some embodiments, the dielectric material fills the trench with the isolation layer and the conductive layer disposed therebetween. The method 100 continues to operation 122 in which a polishing process is performed to form a first conductive column structure. In some embodiments, the polishing process (e.g., a chemical mechanical polishing (CMP) process) is performed on the dielectric material and the conductive layer until an upper boundary of a sidewall portion of the conductive layer is exposed, which accordingly forms the first conductive column structure. As such, the first conductive column structure includes at least two portions: a first portion that is the portion of the conductive layer overlaying the upper boundary of the first electrode; and a second portion that is the sidewall portion of the conductive layer.

Next, the method 100 continues to operation 124 in which a phase change material layer is formed over the first conductive column structure. In some embodiments, the phase change material layer is formed to couple at least the upper boundary of the sidewall portion of the conductive layer (the first conductive column structure). The method 100 continues to operation 126 in which a fourth dielectric layer is formed over the phase change material layer. The method 100 continues to operation 128 in which a second conductive column structure is formed to couple the phase change material layer. In some embodiments, the second conductive column structure, which may be optionally formed in the fourth dielectric layer, is substantially similar to the first conductive column structure. The method 100 continues to operation 130 in which a second electrode is formed to couple the second conductive column structure. In some embodiments, the second electrode, which may be formed in a fifth dielectric layer over the fourth dielectric layer, is substantially similar to the first electrode. In some embodiments, the above-mentioned first, second, third, fourth, and fifth dielectric layers may each be an inter-metal dielectric (IMD) or inter-layer dielectric (ILD) layer, that is, the first, second, third, fourth, and fifth dielectric layers may be formed of a substantially similar dielectric material (e.g., low-k dielectric material).

Figure 2A:
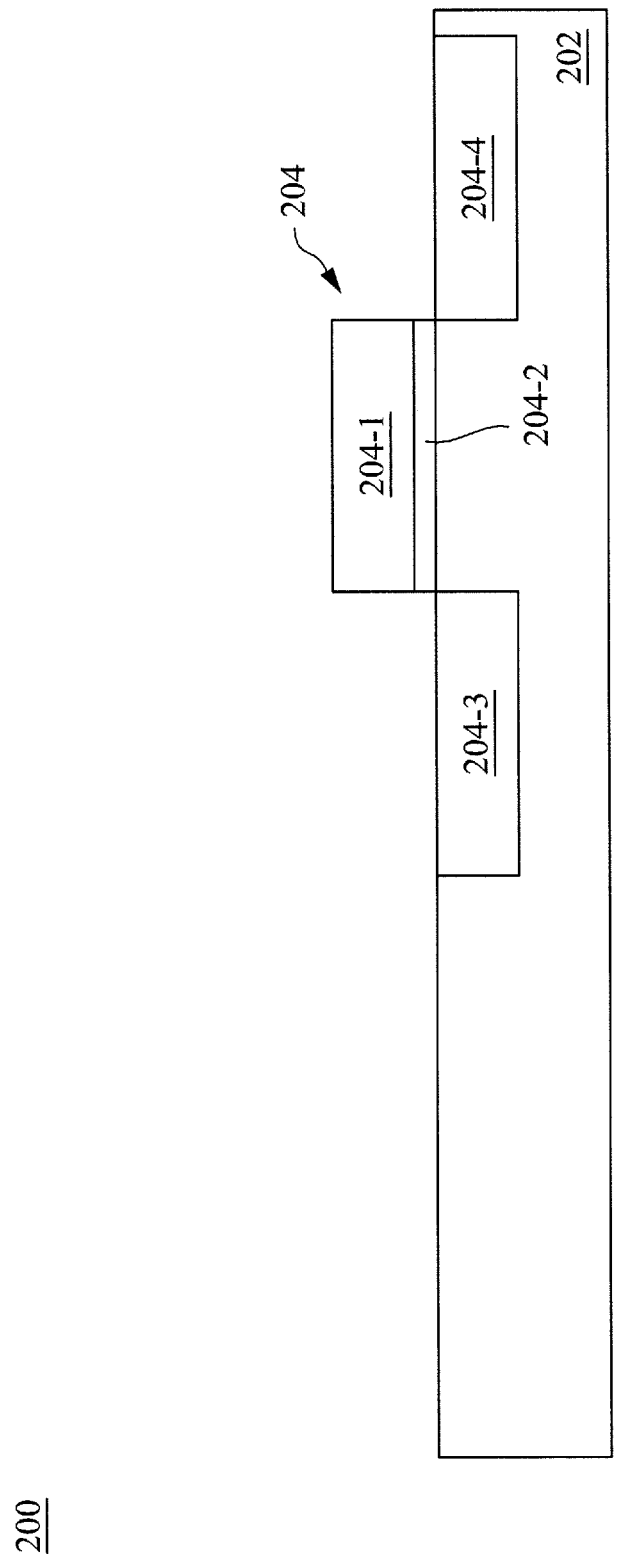
FIG. 2A, 2B, 2C, 2D, 2E, 2F, 2G, 2H, 2I, 2J, 2K, 2L, 2M, 2N, and 2O illustrate cross-sectional views of an exemplary semiconductor device during various fabrication stages, made by the method of FIG. 1, in accordance with some embodiments.

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, 2J, 2K, 2L, 2M, 2N, and 2O, respectively. In some embodiments, the semiconductor device 200 may be a PCRAM device. The PCRAM device 200 may be included in a microprocessor, memory cell, and/or other integrated circuit (IC). Also, FIGS. 2A through 2O are simplified for a better understanding of the concepts of the present disclosure. For example, although the figures illustrate the PCRAM device 200, it is understood the IC, in which the PCRAM device 200 is formed, may include a number of other devices comprising resistors, capacitors, inductors, fuses, etc., which are not shown in FIGS. 2A through 2O, for purposes of clarity of illustration.

Corresponding to operation 102 of FIG. 1A, FIG. 2A is a cross-sectional view of the PCRAM device 200 including a substrate 202 with a transistor 204, which is provided at one of the various stages of fabrication, according to some embodiments. Although the PCRAM device 200 in the illustrated embodiment of FIG. 2A includes only one transistor 204, it is understood that the illustrated embodiment of FIG. 2A and the following figures are merely provided for illustration purposes. Thus, the PCRAM device 200 may include any desired number of transistors while remaining within the scope of the present disclosure.

In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the transistor 204 includes a gate electrode 204-1, a gate dielectric layer 204-2, and source/drain features 204-3 and 204-4. The source/drain features 204-3 and 204-4 may be formed using doping processes such as ion implantation. The gate dielectric layer 204-2 may include a dielectric material such as, silicon oxide, silicon nitride, silicon oxinitride, dielectric with a high dielectric constant (high-k), and/or combinations thereof, which may be formed using deposition processes such as atomic layer deposition (ALD). The gate electrode 204-1 may include a conductive material, such as polysilicon or a metal, which may be formed using deposition processes such as chemical vapor deposition (CVD). In some embodiments, the transistor 204 may serve as an access transistor of the PCRAM device 200, which controls an access to a data storage component (e.g., a PCRAM resistor) of the PCRAM device 200 during read/write operations.

Figure 2B:
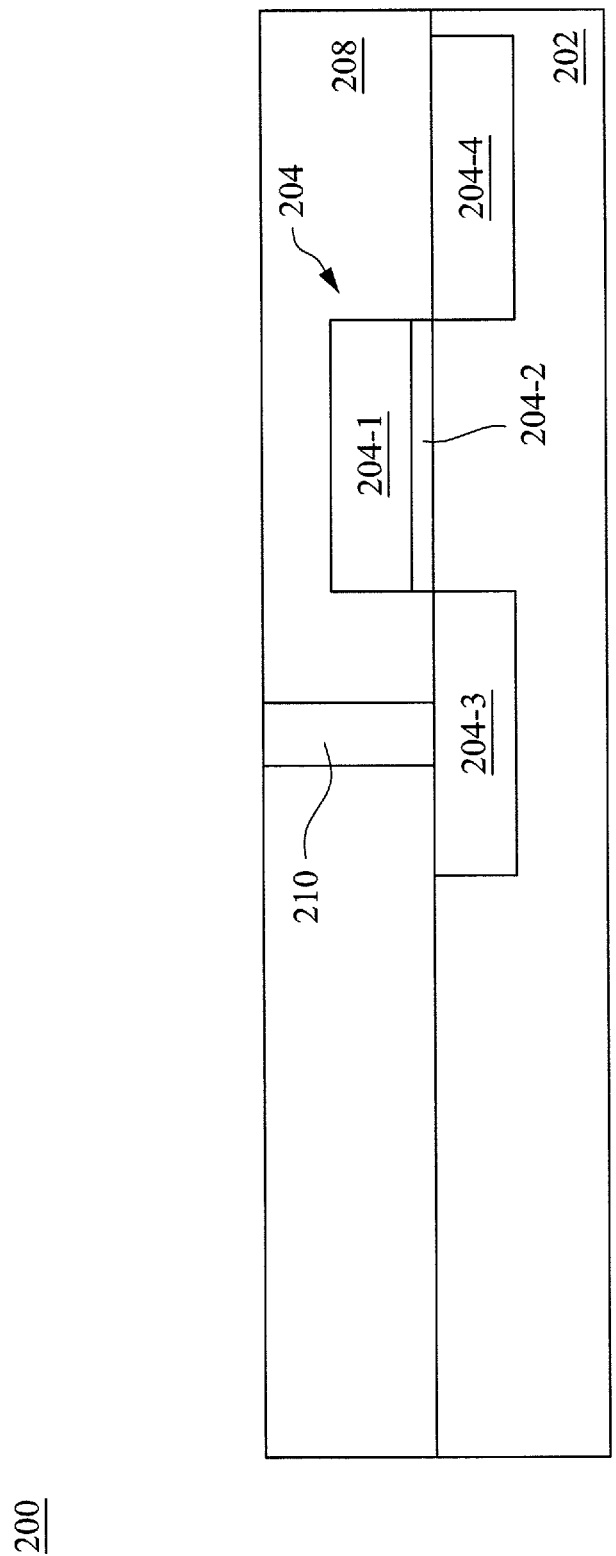

Corresponding to operation 104 of FIG. 1A, FIG. 2B is a cross-sectional view of the PCRAM device 200 including a first dielectric layer 208 with a contact plug 210, which is formed at one of the various stages of fabrication, according to some embodiments. As shown, the first dielectric layer 208 is formed over the transistor 204, and the contact plug 210 is formed to extend through the first dielectric layer 206. In some embodiments, the contact plug 210 is coupled to at least one of the conductive features of the transistor 204. In the illustrated embodiment of FIG. 2B (and the following figures), the contact plug 210 is coupled to the source/drain feature 204-3.

In some embodiments, the first dielectric layer 208 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the contact plug 210 is formed of a conductive material such as, for example, copper (Cu), aluminum (Al), tungsten (W), etc.

The contact plug 210 may be formed by at least some of the following process steps: using chemical vapor deposition (CVD), physical vapor deposition (PVD), spin-on coating, and/or other suitable techniques to deposit the above-described dielectric material of the first dielectric layer 208 over the substrate 202 and the transistor 204; performing one or more patterning processes (e.g., a lithography process, a dry/wet etching process, a cleaning process, a soft/hard baking process, etc.) to form an opening through the dielectric material; using CVD, PVD, E-gun, and/or other suitable techniques to deposit the above-described conductive material to refill the opening; and polishing out excessive conductive material to form the contact plug 210.

Figure 2C:
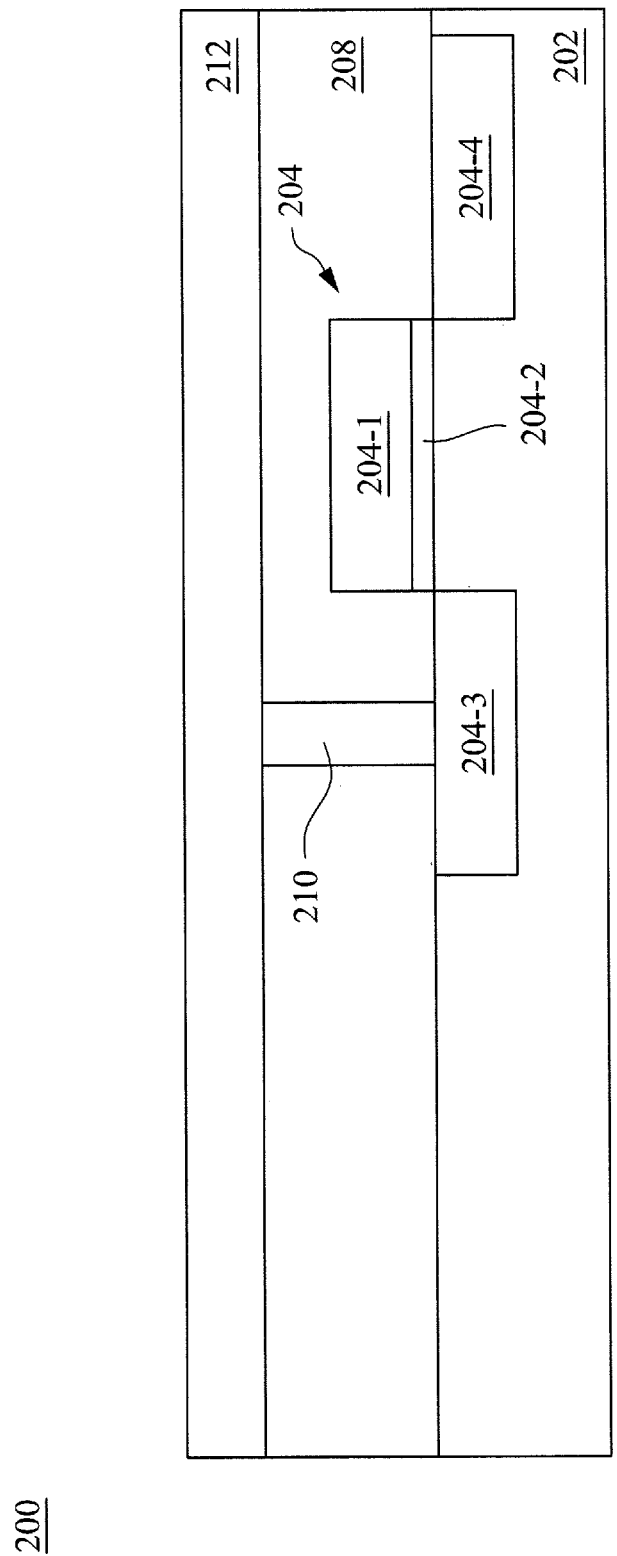

Corresponding to operation 106 of FIG. 1A, FIG. 2C is a cross-sectional view of the PCRAM device 200 including a second dielectric layer 212, which is formed at one of the various stages of fabrication, according to some embodiments. As shown, the second dielectric layer 212 is formed over the first dielectric layer 208 and the contact plug 210.

In some embodiments, the second dielectric layer 212 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The second dielectric layer 212 may be formed by using chemical vapor deposition (CVD), physical vapor deposition (PVD), spin-on coating, and/or other suitable techniques to deposit the above-described dielectric material of the second dielectric layer 212 over the first dielectric layer 208.

Figure 2D:
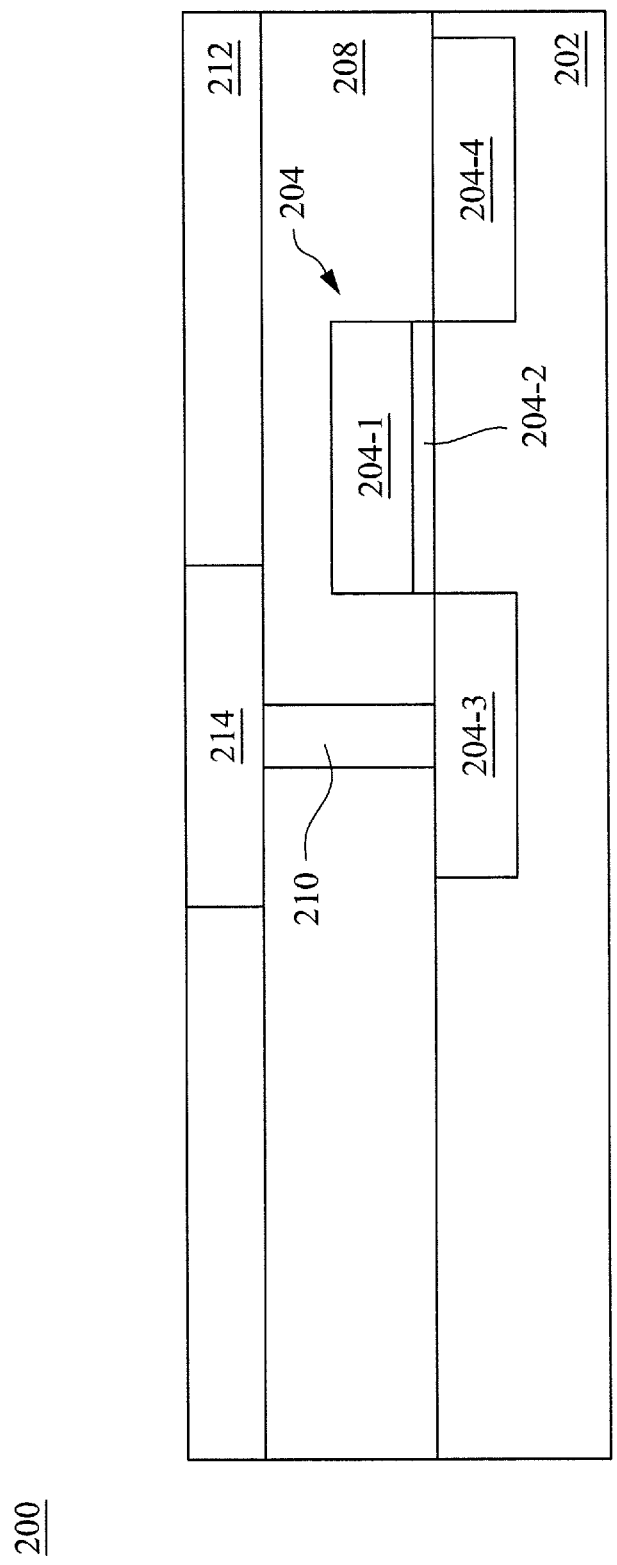

Corresponding to operation 108 of FIG. 1A, FIG. 2D is a cross-sectional view of the PCRAM device 200 including a first electrode 214, which is formed at one of the various stages of fabrication, according to some embodiments. As shown, the first electrode 214 is embedded in the second dielectric layer 212 and horizontally extends along the second dielectric layer 212. In some embodiments, the first electrode 214 is coupled to the contact plug 210, and as will be discussed below, the first electrode 212 may serve as a bottom electrode of the data storage component (e.g., a PCRAM resistor) of the PCRAM device 200.

In some embodiments, the first electrode 214 is formed of a conductive material such as, for example, copper (Cu), aluminum (Al), tungsten (W), etc. The first electrode 214 may be formed by at least some of the following process steps: performing one or more patterning processes (e.g., a lithography process, a dry/wet etching process, a cleaning process, a soft/hard baking process, etc.) to form an opening through the second dielectric layer 212 so as to expose at least a portion of the contact plug 210; using CVD, PVD, E-gun, and/or other suitable techniques to deposit the above-described conductive material to refill the opening; and polishing out excessive conductive material to form the first electrode 214.

Figure 2E:
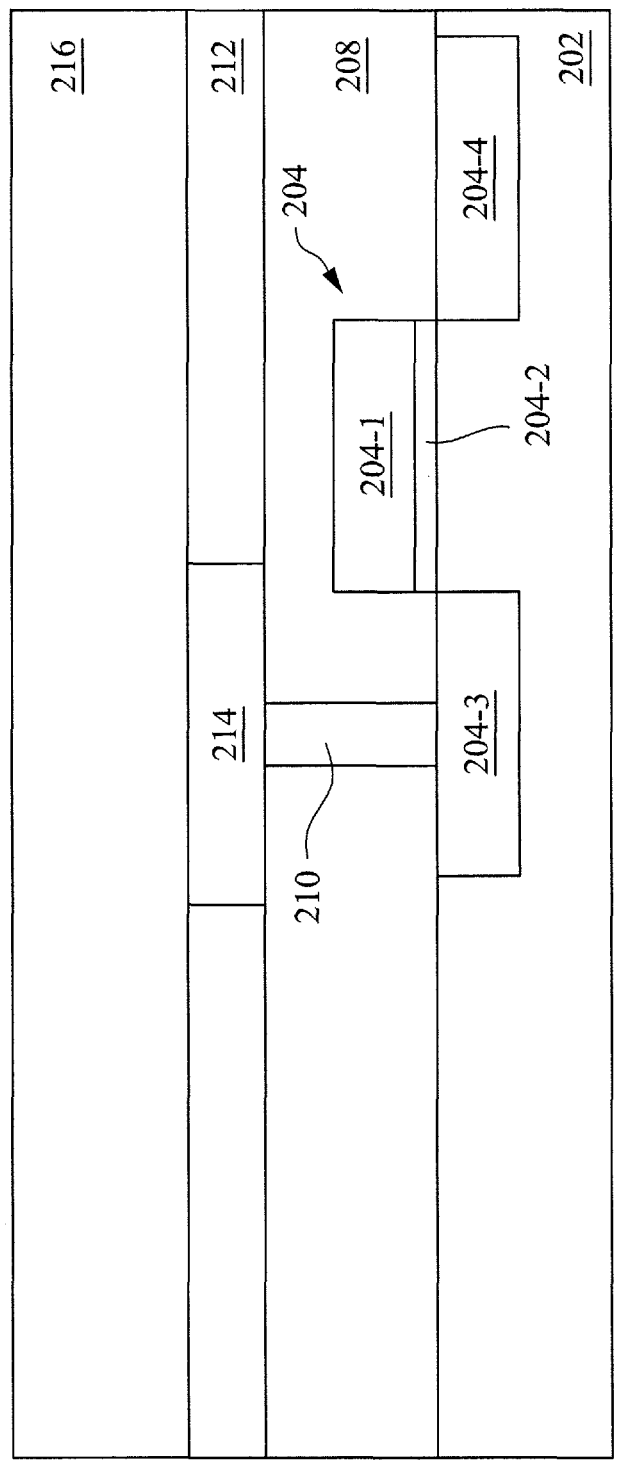

Corresponding to operation 110 of FIG. 1A, FIG. 2E is a cross-sectional view of the PCRAM device 200 including a third dielectric layer 216, which is formed at one of the various stages of fabrication, according to some embodiments. As shown, the third dielectric layer 216 is formed over the second dielectric layer 212 and the first electrode 214.

In some embodiments, the third dielectric layer 216 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The third dielectric layer 216 may be formed by using chemical vapor deposition (CVD), physical vapor deposition (PVD), spin-on coating, and/or other suitable techniques to deposit the above-described dielectric material of the third dielectric layer 216 over the second dielectric layer 212.

Figure 2F:
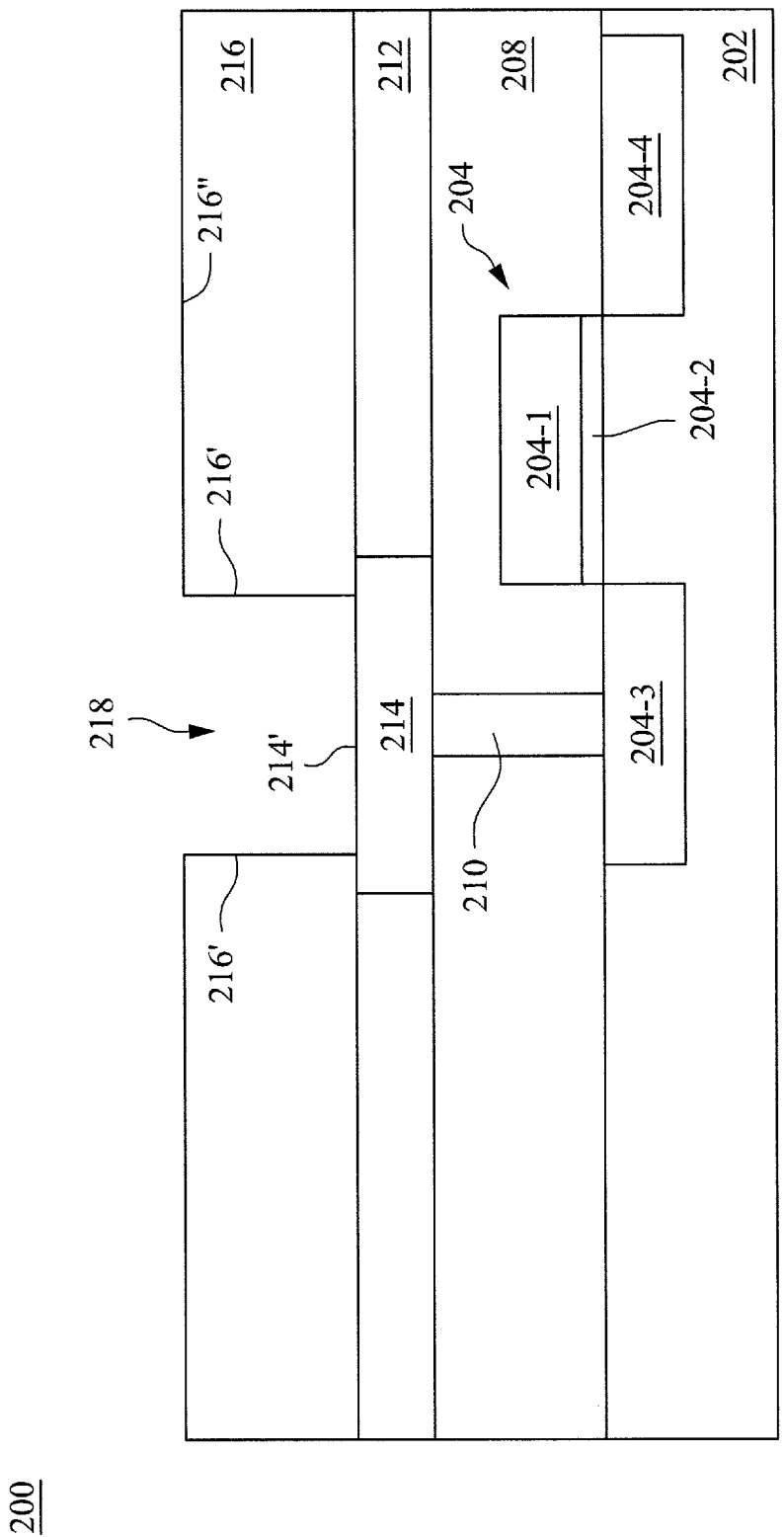

Corresponding to operation 112 of FIG. 1A, FIG. 2F is a cross-sectional view of the PCRAM device 200 in which a portion of the third dielectric layer 216 is etched at one of the various stages of fabrication, according to some embodiments. As shown, after the portion of the third dielectric layer 216 is etched, a trench, or void, 218 that extends through the third dielectric layer 216 is formed. Accordingly, in some embodiments, the trench 218 exposes inner sidewalls 216' of the third dielectric layer 216 and at least a portion of an upper boundary 214' of the first electrode 214.

In some embodiments, the trench 218 is formed by performing at least some of the following process steps: performing one or more patterning processes (e.g., a lithography process, a dry/wet etching process, a cleaning process, a soft/hard baking process, etc.) to form a patternable layer with an opening over the third dielectric layer 216, wherein the opening is laterally aligned with at least a portion of the upper boundary 214' of the first electrode 214; performing one or more dry/wet etching process on the third dielectric layer 216 while using the patternable layer as a mask until the portion of the upper boundary 214' is exposed; and removing the patternable layer.

Figure 2G:
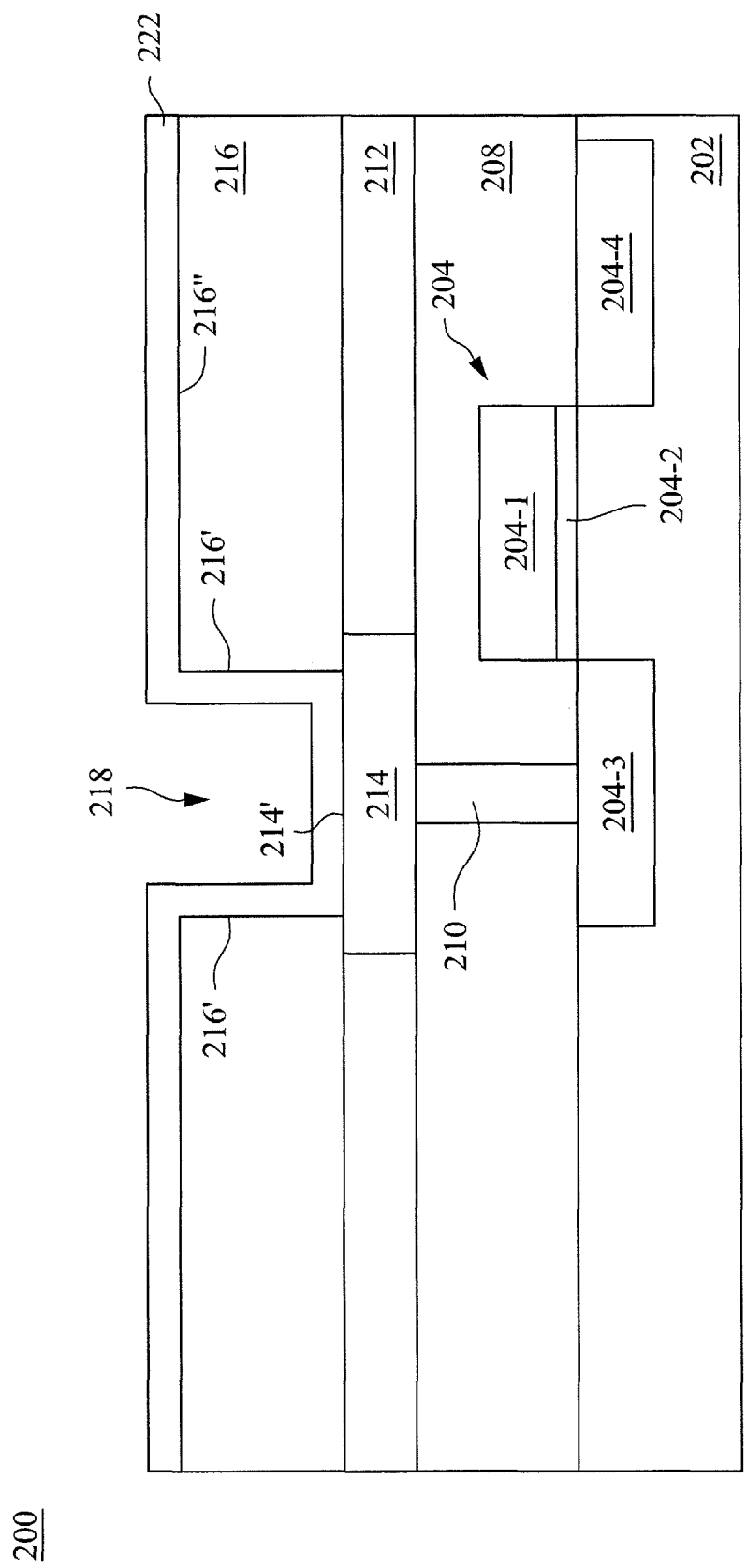

Corresponding to operation 114 of FIG. 1A, FIG. 2G is a cross-sectional view of the PCRAM device 200 including an isolation layer 222, which is formed at one of the various stages of fabrication, according to some embodiments. As shown, the isolation layer 222 is formed to overlay an upper boundary 216" of the third dielectric layer 216, and line the trench 218 (i.e., extending along the sidewalls 216' and overlaying the upper boundary 214'). In some embodiments, the isolation layer 222 is substantially thin and conformal so that the profile of the trench 218 may remain present after the formation of the isolation layer 222.

In some embodiments, the isolation layer 222 is formed of a dielectric material, for example, silicon oxide, silicon nitride, or the like. The isolation layer 222 may be formed by using chemical vapor deposition (CVD), physical vapor deposition (PVD), spin-on coating, and/or other suitable techniques to deposit the above-described dielectric material of the isolation layer 222 over the etched third dielectric layer 216.

Figure 2H:
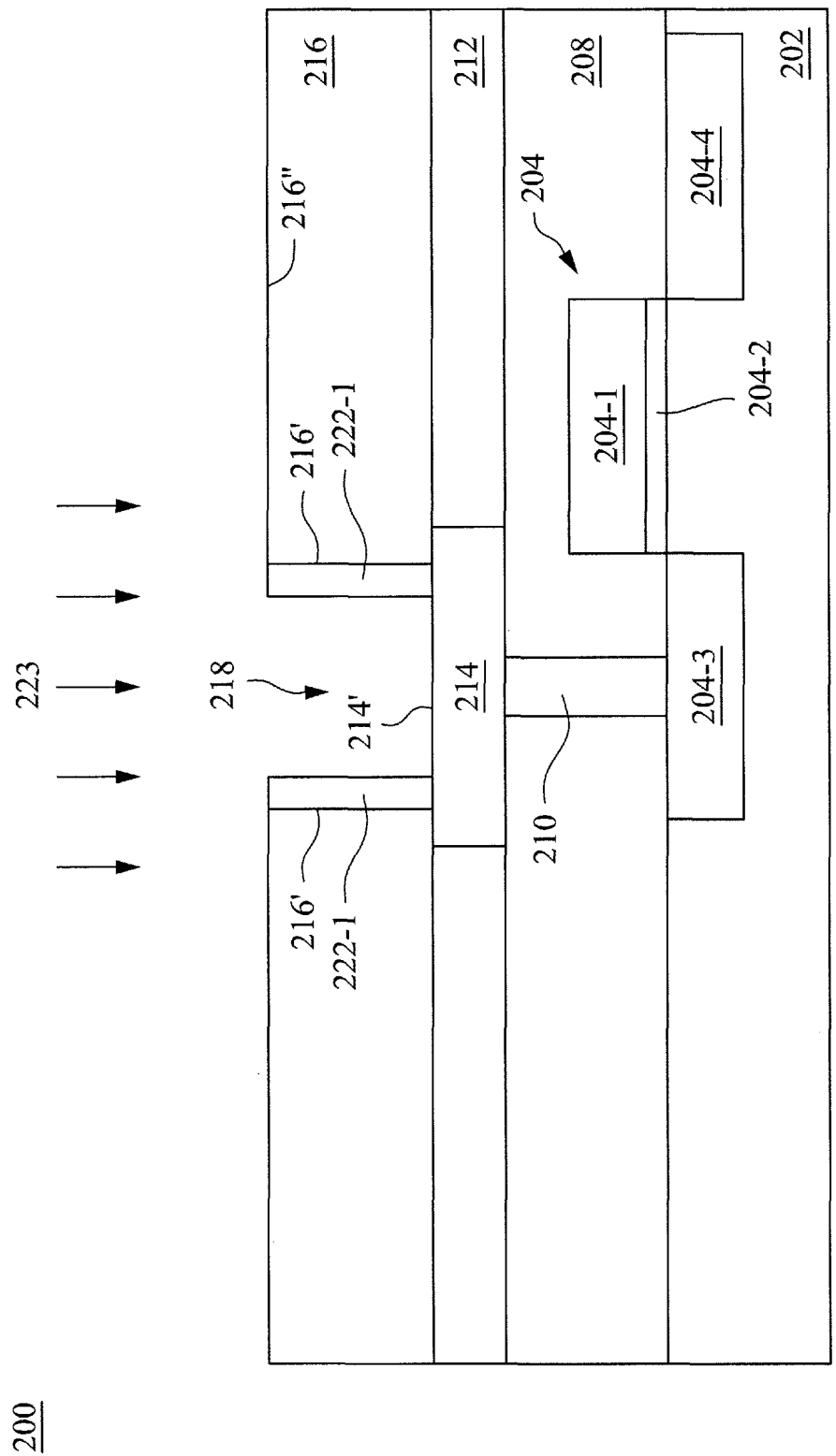

Corresponding to operation 116 of FIG. 1A, FIG. 2H is a cross-sectional view of the PCRAM device 200 in which an etching process 223 is performed at one of the various stages of fabrication, according to some embodiments. According to some embodiments, the etching process 223 may be an anisotropic etching process (e.g., a reactive ion etching (RIE) process). Thus, concurrently with or subsequently to the etching process 223, portions of the isolation layer 222 that overlay the upper boundaries 214' of the first electrode 214 and 216" of the third dielectric layer 216, respectively, are removed, which leaves sidewall portions 222-1 of the isolation layer 222 intact. As shown in the illustrated embodiment of FIG. 2H (and the following figures), the sidewall portions 222-1 extends along the sidewall 216' of the third dielectric layer 216.

Figure 2I:
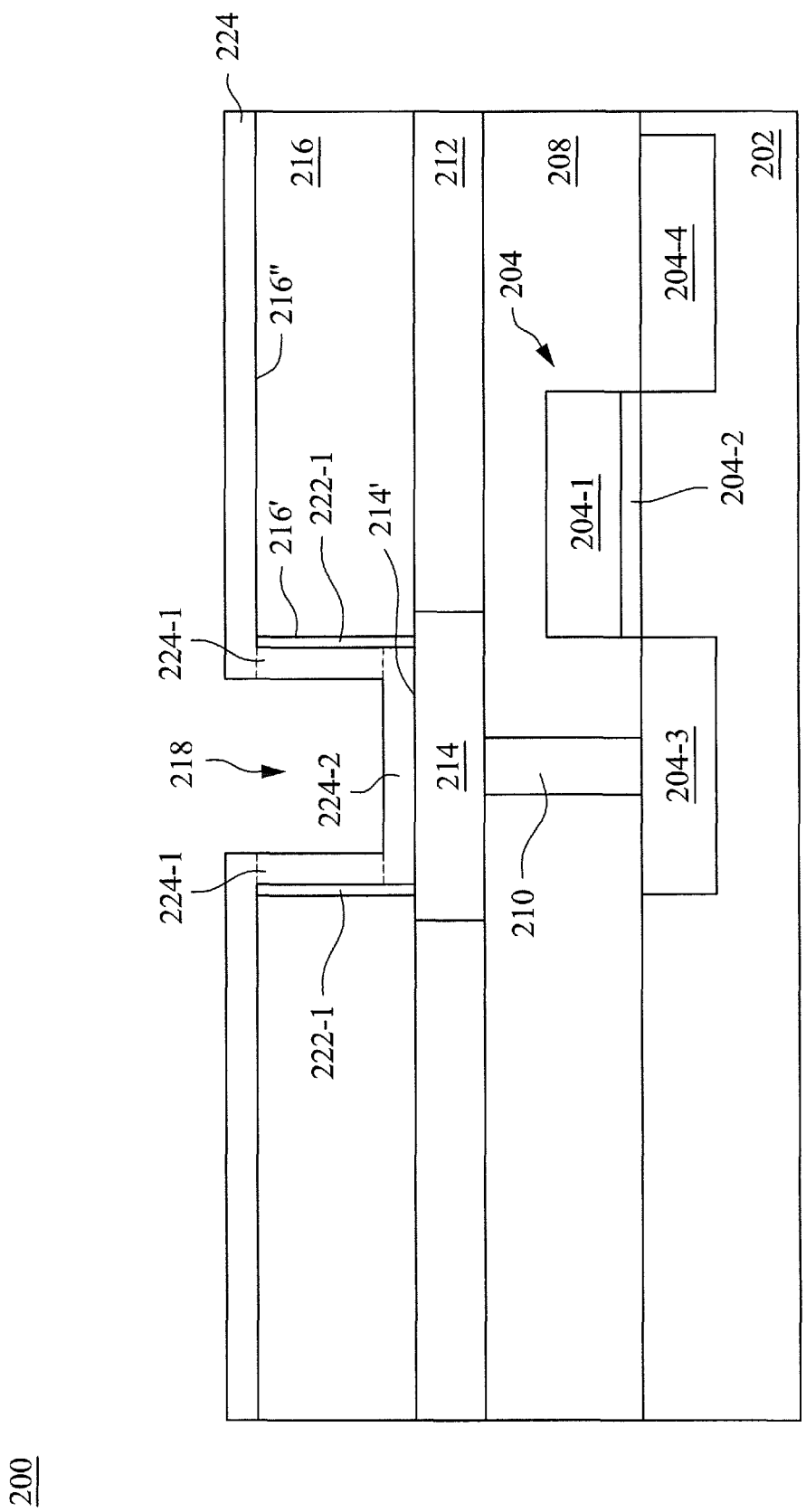

Corresponding to operation 118 of FIG. 1B, FIG. 2I is a cross-sectional view of the PCRAM device 200 including a conductive layer 224, which is formed at one of the various stages of fabrication, according to some embodiments. As shown, the conductive layer 224 is formed to line the trench 218 and overlay the upper boundary 216". More specifically, the conductive layer 224 lines the trench 218 by extending along the sidewall portions 222-1 of the isolation layer 222 with respective sidewall portions 224-1 and overlaying the upper boundary 214' of the first electrode 214 with a bottom portion 224-2. In some embodiments, the conductive layer 224 is substantially thin and conformal (e.g., 1 nanometers to 10 nanometers) so that the profile of the trench 218 may remain present after the formation of the conductive layer 224.

Although in FIG. 2I (and the following figures), the conductive layer 224 is illustrated as a single layer, it is understood that the conductive layer 224 may include two or more layers stacked on the top of one another, each of which may be formed of a conductive material such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. In some embodiments, the first conductive layer 224 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described conductive material over the etched third dielectric layer 216 and the sidewall portions 222-1 of the isolation layer 222.

Figure 2J:
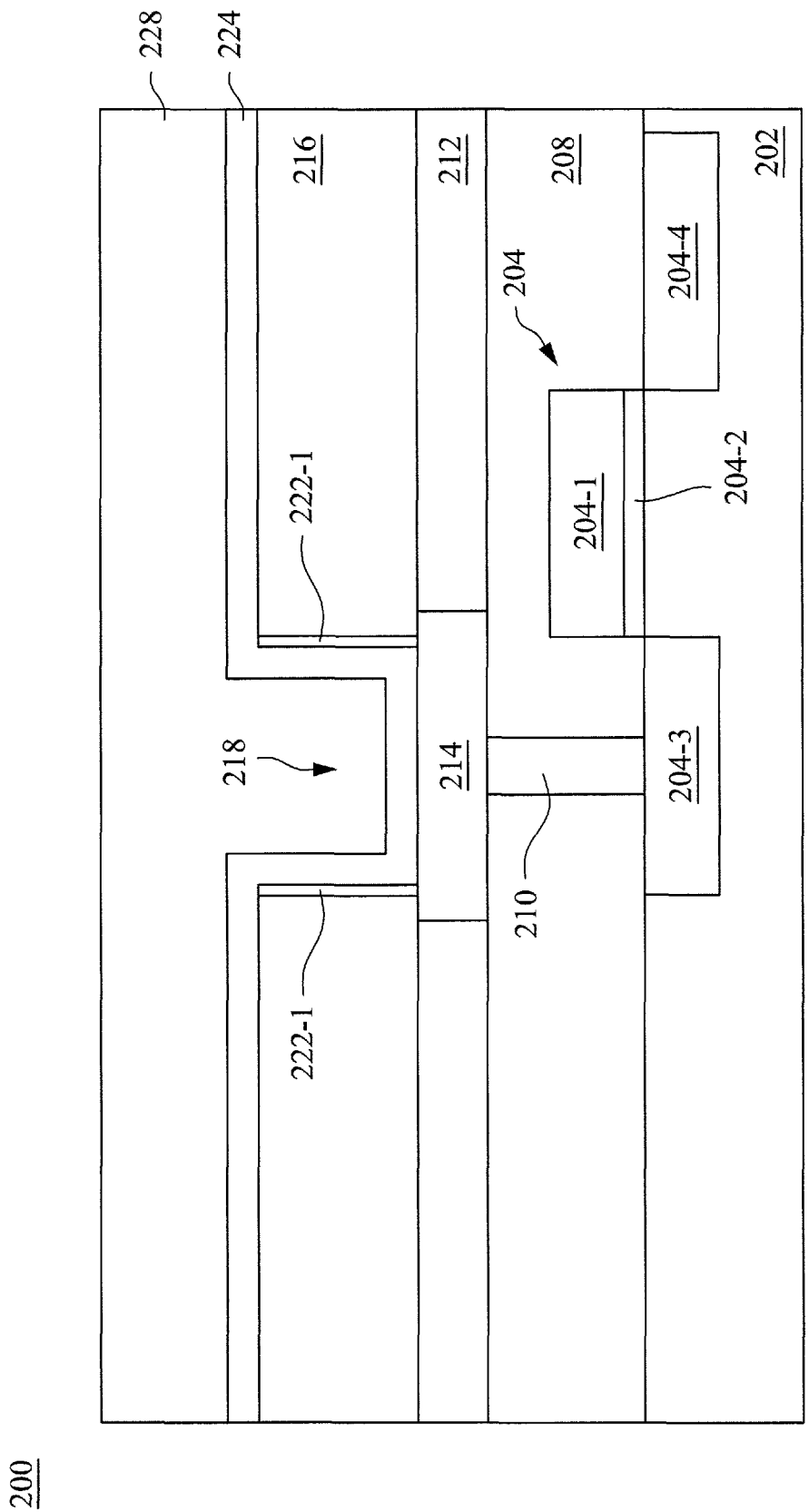

Corresponding to operation 120 of FIG. 1B, FIG. 2J is a cross-sectional view of the PCRAM device 200 including a dielectric material 228, which is deposited at one of the various stages of fabrication, according to some embodiments. As shown, the dielectric material 228 is formed to overlay the conductive layer 224, which accordingly fills the trench 218 with the dielectric material 228.

In some embodiments, the dielectric material 228 is formed of a substantially similar dielectric material as the third dielectric layer 216. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The dielectric material 228 may be formed by using chemical vapor deposition (CVD), physical vapor deposition (PVD), spin-on coating, and/or other suitable techniques to deposit the above-described dielectric material over the conductive layer 224.

Figure 2K:
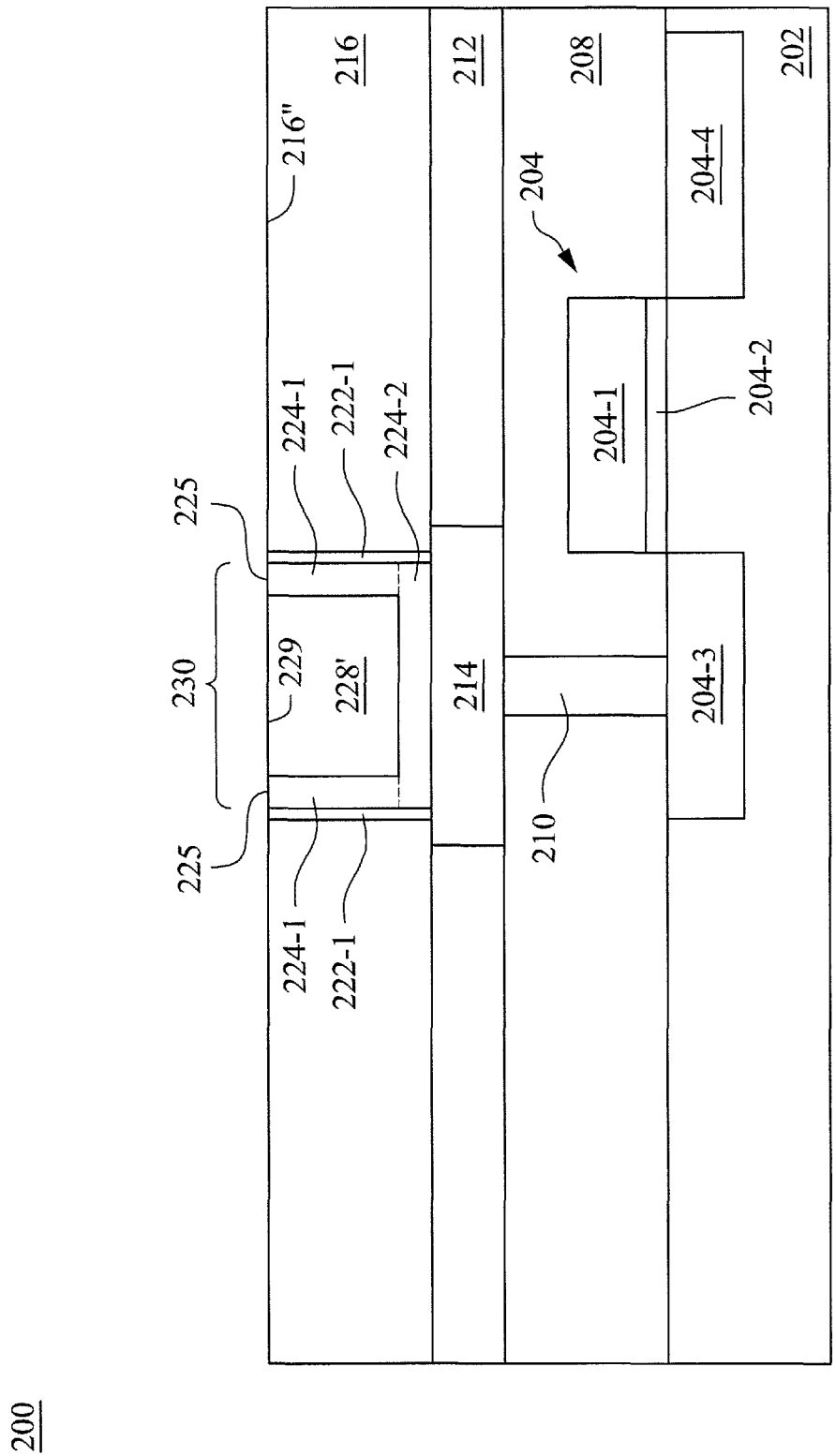

Corresponding to operation 122 of FIG. 1B, FIG. 2K is a cross-sectional view of the PCRAM device 200 including a first conductive column structure 230, which is formed at one of the various stages of fabrication, according to some embodiments. According to some embodiments, the first conductive column structure 230 is formed by performing at least one CMP process on the dielectric material 228 and the conductive layer 224 disposed thereunder (FIG. 2J) until respective upper boundaries 225 of the sidewall portions 222-1 are exposed. Accordingly, a remaining portion 228' of the dielectric material 228 is surrounded by the sidewall portions 224-1 and bottom portion 224-2 of the conductive layer 224 at its sidewalls and a bottom boundary, which exposes a respective upper boundary 229. In other words, the first conductive column structure 230 may include a first portion 224-1 formed as a shell structure (hereinafter "shell portion 224-1") surrounding the remaining portion 228' formed as a core structure, and a second portion 224-2 coupled to one end of such a shell structure (hereinafter "end portion 224-2").

Figure 2L:
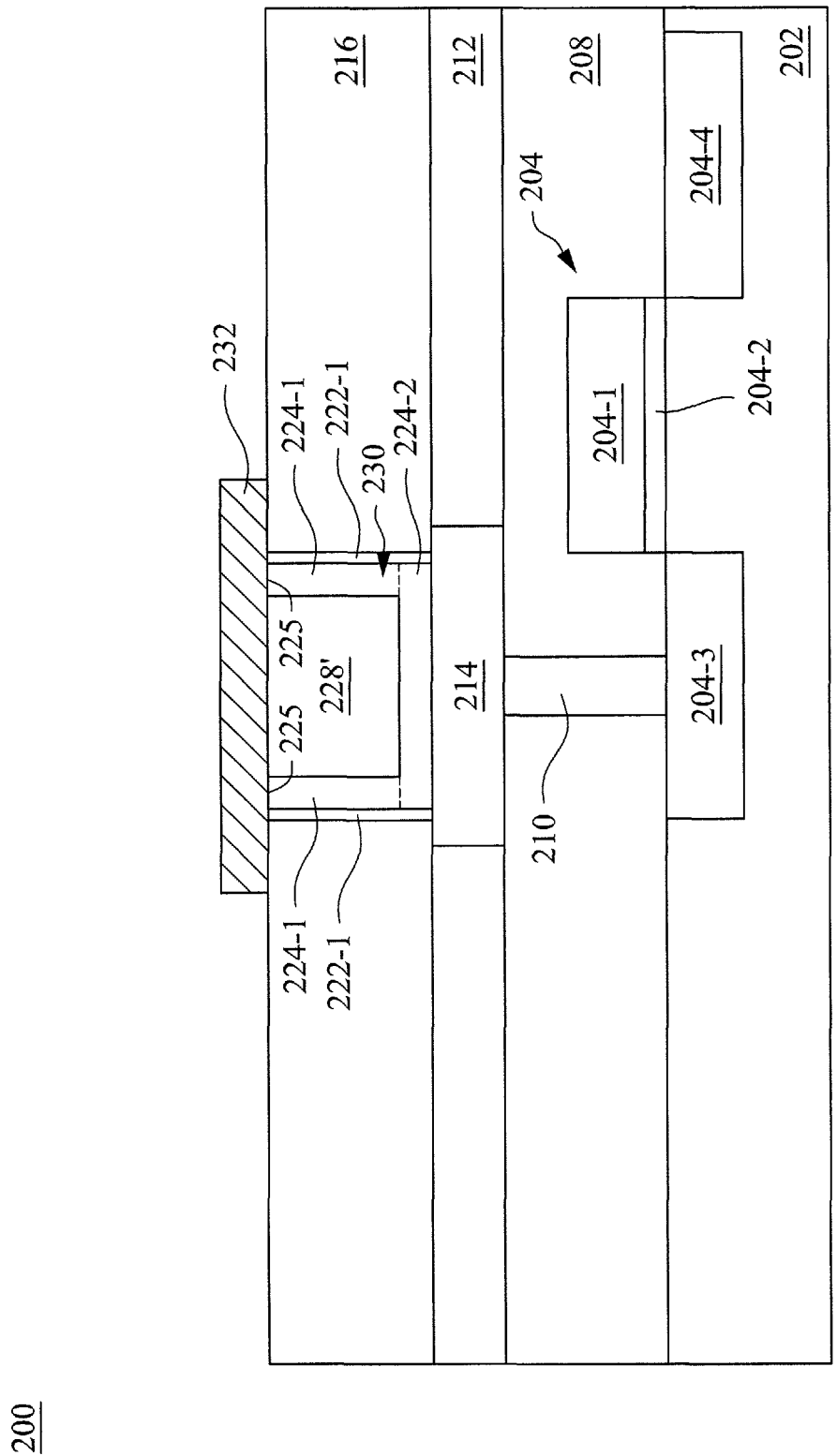

Corresponding to operation 124 of FIG. 1B, FIG. 2L is a cross-sectional view of the PCRAM device 200 including a phase change material layer 232, which is formed at one of the various stages of fabrication, according to some embodiments. As shown, the phase change material layer 232 is formed over the etched third dielectric layer 216 to couple at least part of the first conductive column structure 230. In the illustrated embodiment of FIG. 2L, the phase change material layer 232 is coupled to both the shell portions 224-1 of the first conductive column structure 230. More specifically, the phase change material layer 232 overlays both the boundaries 225 of the shell portions 224-1. In some other embodiments, the phase change material layer 232 may be only coupled to part of the shell portions 224-1 (e.g., one of the shell portions 224-1), which will be illustrated and discussed below with respect to FIGS. 3A-3F.

In some embodiments, the phase change material layer 232 includes a chalcogenide-based material. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). For example, chalcogenide alloys include combinations including one or more of antimony (Sb), gallium (Ga), indium (In), and silver (Ag). Exemplary materials of the phase change material layer 232 include alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S.

In some embodiments, the phase change material layer 232 may be formed by an atomic layer deposition (ALD) technique with a precursor containing a metal and oxygen. In some embodiments, other chemical vapor deposition (CVD) techniques may be used. In some embodiments, the phase change material layer 232 may be formed by a physical vapor deposition (PVD) technique, such as a sputtering process with a metallic target and with a gas supply of oxygen and optionally nitrogen to the PVD chamber. In some embodiments, the phase change material layer 232 may be formed by an electron-beam deposition technique.

Figure 2M:
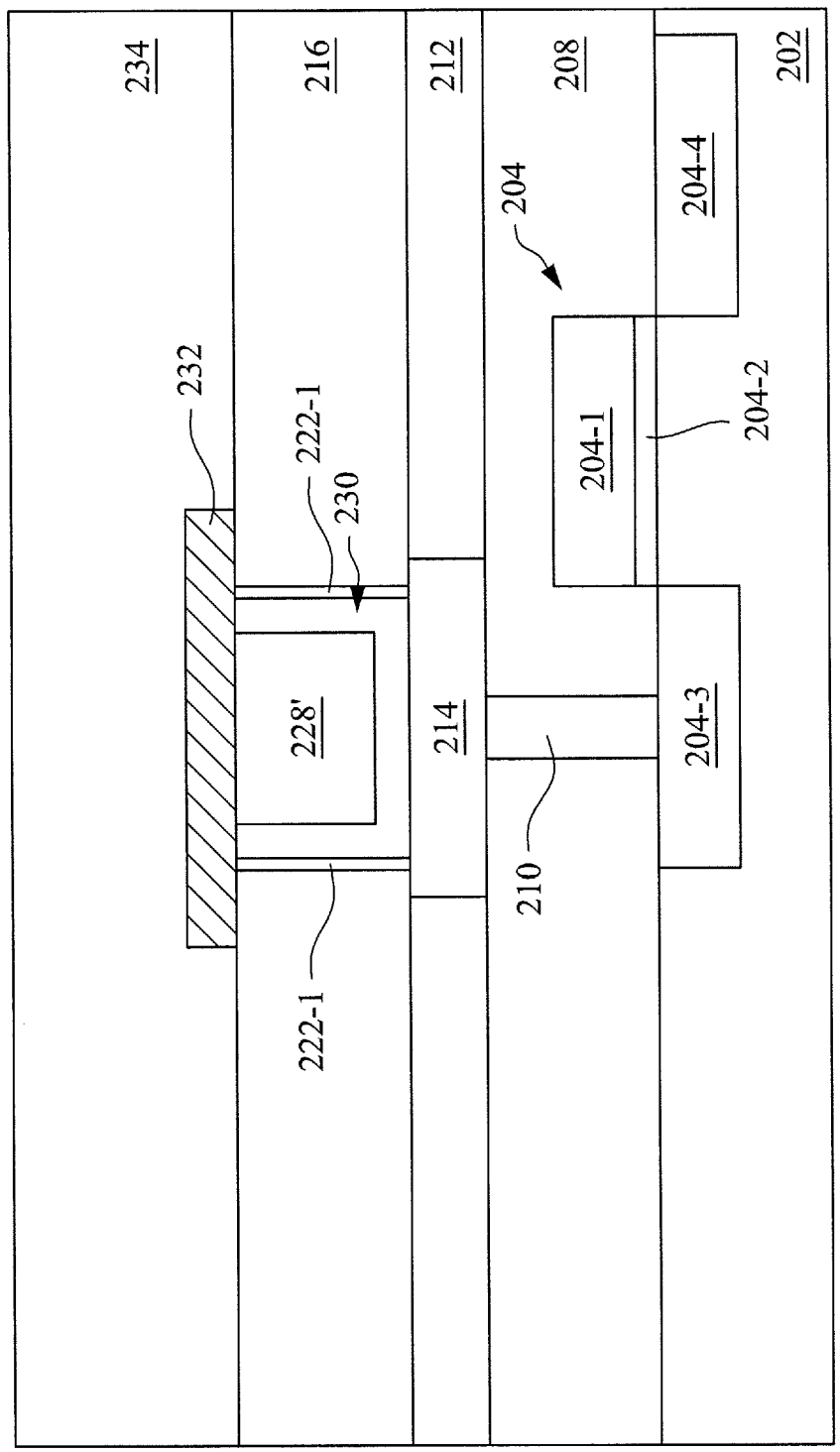

Corresponding to operation 126 of FIG. 1B, FIG. 2M is a cross-sectional view of the PCRAM device 200 including a fourth dielectric layer 234, which is formed at one of the various stages of fabrication, according to some embodiments. As shown, the fourth dielectric layer 234 is formed over the etch third dielectric layer 216 to overlay the phase change material layer 232.

In some embodiments, the fourth dielectric layer 234 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The fourth dielectric layer 234 may be formed by using chemical vapor deposition (CVD), physical vapor deposition (PVD), spin-on coating, and/or other suitable techniques to deposit the above-described dielectric material of the fourth dielectric layer 234 over the etched third dielectric layer 216 and the phase change material layer 232.

Figure 2N:
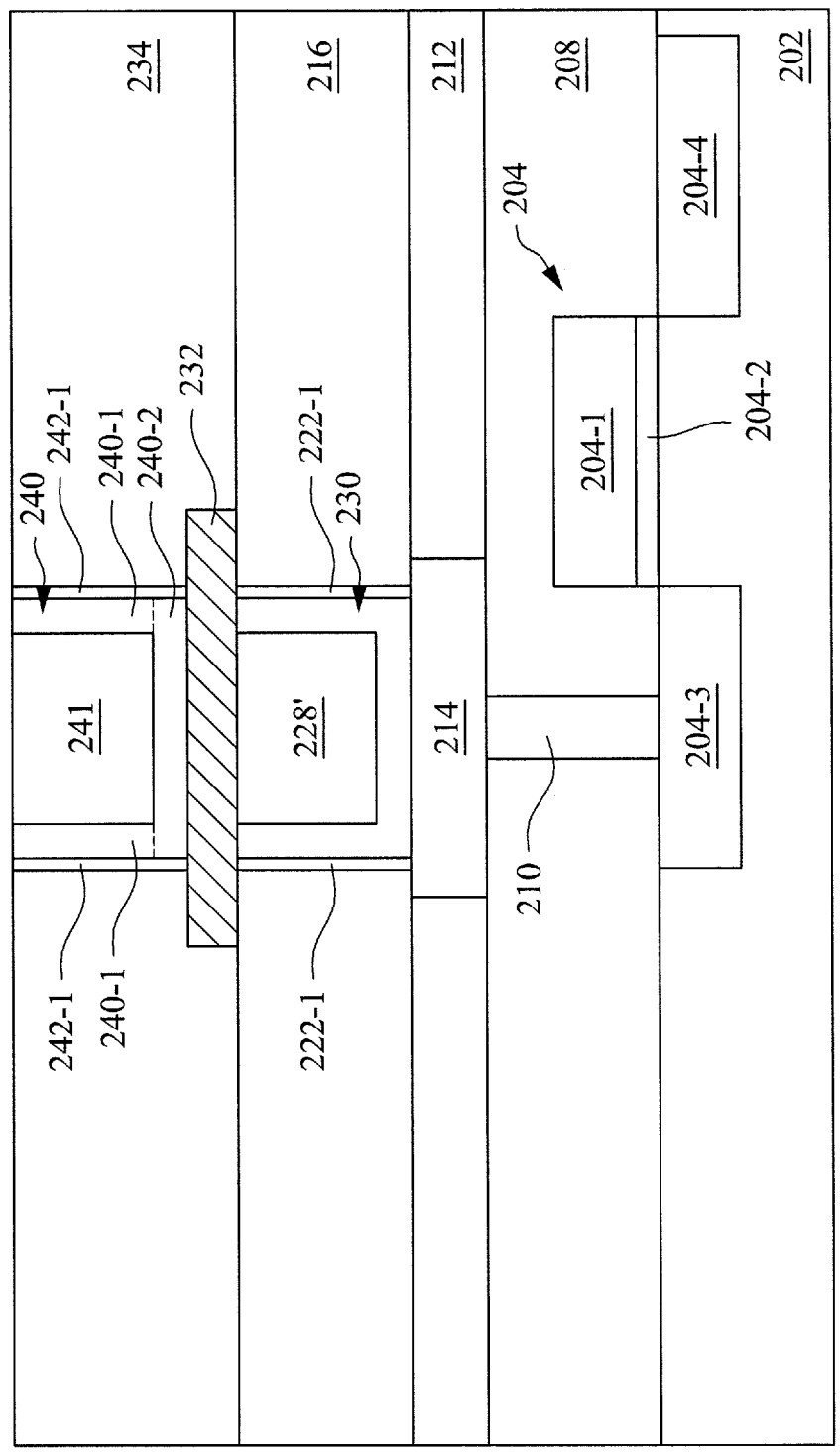
Figure 2O:
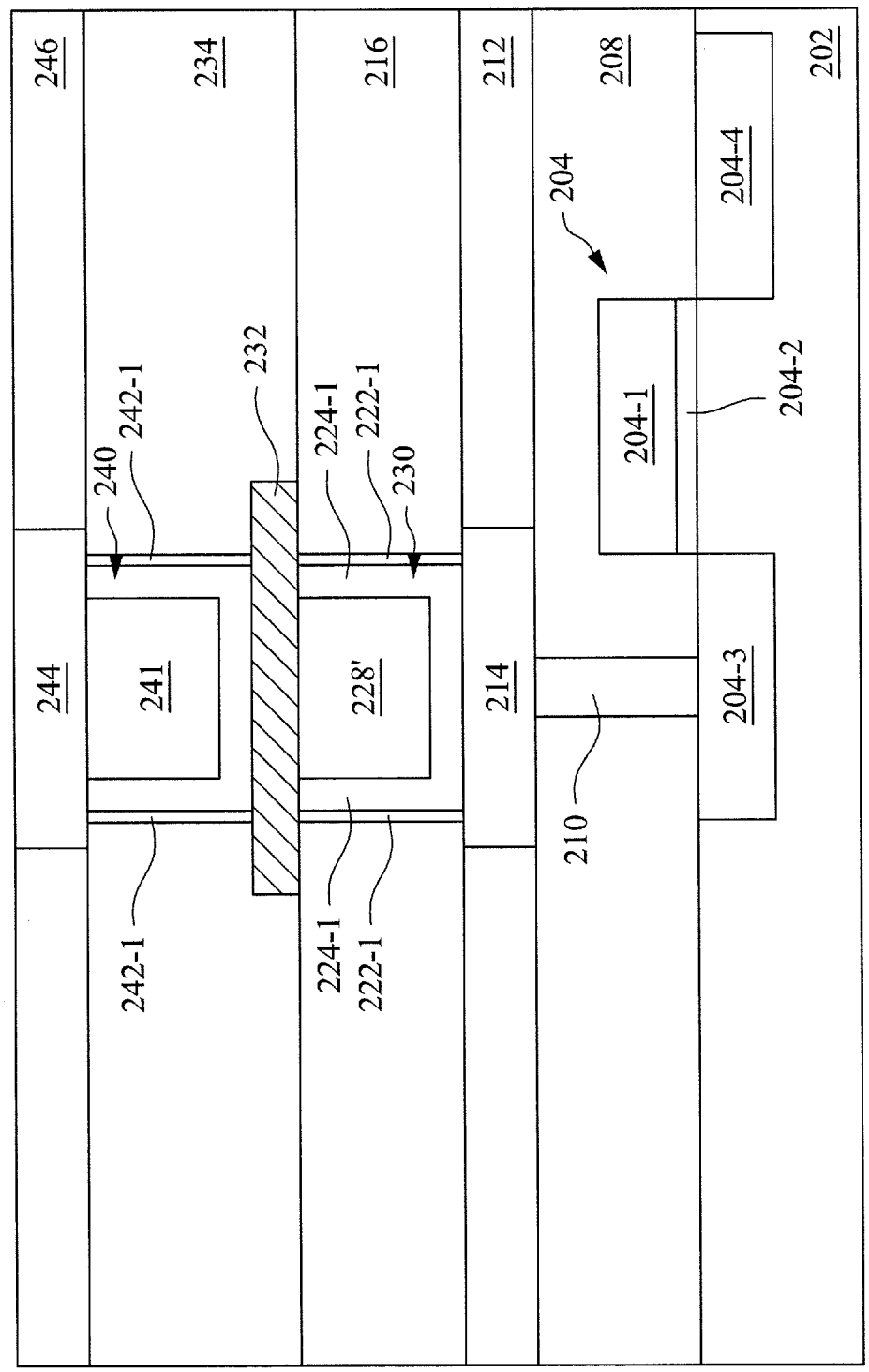

Corresponding to operation 128 of FIG. 1B, FIG. 2N is a cross-sectional view of the PCRAM device 200 including a second conductive column structure 240, which is formed at one of the various stages of fabrication, according to some embodiments. As shown, the second conductive structure 240 extends through part of the fourth dielectric layer 234 to couple the phase change material layer 232.

In some embodiments, the second conductive column structure 240 is substantially similar to the first conductive column structure 230 so that the configuration of the second conductive column structure 240 is briefly discussed below, and the formation of the second conductive column structure 240 is not repeated here. The second conductive column structure 240 also includes a shell portion 242-1 surrounding a core structure formed of a remaining portion 241 of a dielectric material (similar as the dielectric material 228 of FIG. 2J), and an end portion 242-2 coupled to one end of the shell portion 242-1. As such, the second conductive column structure 240 is coupled to the phase change material layer 232 via the end portion 242-2, and to the fourth dielectric layer 234 via the sidewall portion 242-1 with an isolation layer 242-1 disposed therebetween. In some embodiments, the isolation layer 242-1 is substantially similar to the sidewall portion 222-1. Further, although in the illustrated embodiment of FIG. 2N the second conductive column structure 240 is aligned with the first conductive column structure 230, it is noted that the second conductive column structure 240 may be laterally shifted from the first conductive column structure 230 (as long as the second conductive column structure 240 is still coupled to the phase change material layer 232) while remaining within the scope of the present disclosure.

Corresponding to operation 130 of FIG. 1B, FIG. 2O is a cross-sectional view of the PCRAM device 200 including a second electrode 244, which is formed at one of the various stages of fabrication, according to some embodiments. As shown, the second electrode 244 is embedded in a fifth dielectric layer 246 and horizontally extends along the fifth dielectric layer 246. In some embodiments, the second electrode 244 is coupled to the second conductive column structure 240, and as will be discussed below, the second electrode 212 may serve as a top electrode of the data storage component (e.g., a PCRAM resistor) of the PCRAM device 200.

In some embodiments, the second electrode 244 is formed of a conductive material such as, for example, copper (Cu), aluminum (Al), tungsten (W), etc. The second electrode 244 may be formed by at least some of the following process steps: performing one or more patterning processes (e.g., a lithography process, a dry/wet etching process, a cleaning process, a soft/hard baking process, etc.) to form an opening through the fifth dielectric layer 246 so as to expose at least a portion of the second conductive column structure 240; using CVD, PVD, E-gun, and/or other suitable techniques to deposit the above-described conductive material to refill the opening; and polishing out excessive conductive material to form the second electrode 244. It is noted that in some embodiments, each of the above-described first/second/third/fourth/fifth dielectric layers (208/212/216/234/246) may be an inter-metal dielectric (IMD) or inter-layer dielectric (ILD) layer.

In some embodiments, after the formation of the second electrode 244, a PCRAM resistor of the PCRAM device 200 may be formed. More specifically, the first electrode 214 may serve as the bottom electrode of the PCRAM resistor, the first conductive column structure 230 may serves as the heater structure of the PCRAM resistor, the phase change material layer 232 may be configured to switch between the low and high resistance states by being transitioned to the partially crystalline and amorphous states, respectively, the second conductive column structure 240 may serve as an optional heater structure of the PCRAM resistor, and the second electrode 244 may serve as the top electrode.

In operation, the PCRAM device 200 may be "granted" to be accessed through the access transistor 204. Upon accessed, the PCRAM device 200 may transition between the low and high resistance states through set and reset operations, respectively, as discussed above. When compared to the conventional PCRAM devices, a contact area size between the heater structure (e.g., the first conductive column structure 230) and the phase change material layer 232 is significantly reduced. Specifically, in the illustrated embodiment of FIG. 2O, the contact area size may be defined as twice the cross-sectional area of the shell portion 224-1 (i.e., the thickness of the conductive layer 224, as described with respect to FIG. 2I), which is significantly smaller than the contact area size of the conventional PCRAM devices that typically includes additional cross-sectional area of the remaining portion 228'. Accordingly, the current level of an electrical current signal applied to transition the resistance states of the phase change material layer 232 can be advantageously reduced, which avoids various issues that the conventional PCRAM device are facing.

FIGS. 3A, 3B, 3C, 3D, 3E, and 3F respectively illustrate top views of various embodiments of how the first conductive column structure 230 that extends through the dielectric layer 216 is spatially configured with respect to the phase change material layer 232 that is disposed in another dielectric layer above the dielectric layer 216. As will be discussed below, the shell portion 224-1 of the first conductive column structure 230 may be formed as a circular or polygonal ring when viewed from the top; the phase change material layer 232 may be formed to have circular shape, a polygonal shape, or a circumferential shape when viewed from the top; and the phase change material layer 232 may be partially overlapped with (i.e., coupled to) a portion of the shell portion 224-1 of the first conductive column structure 230.

For example, in FIG. 3A, the shell portion 224-1 is formed as a rectangular ring that surrounds the remaining portion 228' of the dielectric material 228. Alternatively stated, the shell portion 224-1 has an inner boundary and an outer boundary that each form a circumference of a rectangle shape. And the phase change material layer 232, formed as a rectangular shape, overlaps (e.g., contacts) part of such a rectangular ring. Accordingly, a corresponding contact area size may be defined as a cross-sectional area of overlapping 301 enclosed by dotted lines. In FIG. 3B, the shell portion 224-1 is formed as a rectangular ring that is substantially similar to the one shown in FIG. 3A, but the phase change material layer 232, also formed as a rectangular shape, overlaps the shell portion 224-1 by a smaller area (a cross-sectional area of overlapping 303 enclosed by dotted lines).

In FIG. 3C, the shell portion 224-1 is formed as a circular ring surrounds the remaining portion 228' of the dielectric material 228. Alternatively stated, the shell portion 224-1 has an inner boundary and an outer boundary that each form a circumference of a circular shape. And the phase change material layer 232, formed as a rectangular ring (e.g., a circumferential shape), overlaps part of such a circular ring. Accordingly, a corresponding contact area size may be defined as a cross-sectional area of overlapping 305 enclosed by dotted lines.

In FIG. 3D, the shell portion 224-1 is faulted as a first circular ring surrounds the remaining portion 228' of the dielectric material 228, and the phase change material layer 232 (enclosed by dotted lines) is formed as a second circular ring. Further, in some embodiments, such a first circular ring (the shell portion 224-1) may overlap with the second circular ring (the phase change material layer 232) by running along a circumference of the second circular ring, which defines an overlapping (not shown) that is part of the cross-sectional area of either the first or second circular ring.

Figures 3E, 3F:
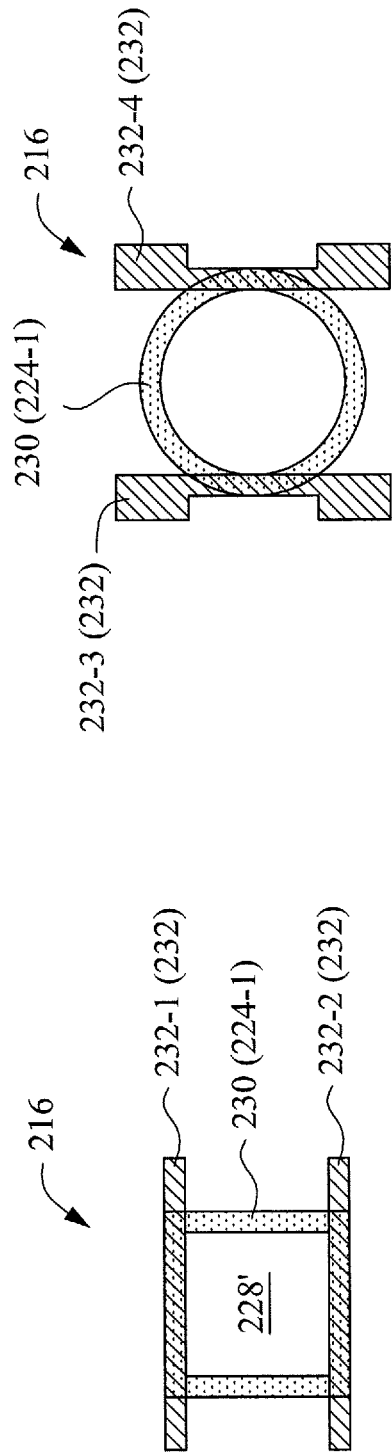

In FIG. 3E, the shell portion 224-1 is formed as a rectangular ring and the phase change material layer 232 is formed as a rectangular shape, which is similar to FIGS. 3A and 3B, except that the phase change material layer 232 may be formed to have two or more respective different portions. For example, in the illustrated embodiment of FIG. 3E, the phase change material layer 232 includes a first portion 232-1 and a second portion 232-2 that are laterally spaced apart from each other and respectively overlapped with the rectangular ring of the shell portion 224-1.

In FIG. 3F, the shell portion 224-1 is formed as a circular ring and the phase change material layer 232 is formed to have two rectangle shapes that are laterally spaced apart from each other. For example, in the illustrated embodiment of FIG. 3F, the phase change material layer 232 includes a first portion 232-3 and a second portion 232-4 that are respectively overlapped with the circular ring of the shell portion 224-1.

In an embodiment, a memory device includes: a first conductive column structure extending through a first dielectric layer, wherein the first conductive column structure comprises a shell portion wrapping a core structure filled with a dielectric material and an end portion that is coupled to one end of the shell portion and disposed below the core structure; and a first phase change material layer formed over the first dielectric layer, wherein a lower boundary of the first phase change material layer contacts at least a first portion of the other end of the shell portion of the first conductive column structure.

In another embodiment, a memory device includes: a bottom electrode; a phase change material layer; and a heater structure, coupled between the bottom electrode and the phase change material layer, that lines a trench thereby causing a first portion of the heater structure to contact the phase change material layer at one end and wrap a dielectric material directly disposed below the phase change material layer.

Yet in another embodiment, a method includes: forming a first dielectric layer over a bottom electrode; forming a first void extending through the first dielectric layer to expose a portion of an upper boundary of the bottom electrode; forming a first conductive structure lining along respective sidewalls of the first void and the exposed portion of the upper boundary of the bottom electrode; filling the first void with the first dielectric layer; and forming a phase change material layer over the first dielectric layer to cause the phase change material layer to contact at least a portion of a sidewall of the first conductive structure.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first conductive column structure extending entirely through a first dielectric layer, wherein the first conductive column structure comprises a shell portion wrapping a core structure filled with a dielectric material and an end portion that is coupled to a first end of the shell portion and disposed below the core structure, wherein the shell portion comprises a conductive layer;
   a first phase change material layer formed over the first dielectric layer, wherein a lower boundary of the first phase change material layer contacts at least a first portion of a second end of the shell portion, the second end being opposite the first end;
   a second dielectric layer disposed above the first phase change material layer; and
   a second conductive column structure extending through the second dielectric layer, wherein the second conductive column structure comprises a shell portion wrapping a core structure filled with a dielectric material and an end portion that is coupled to one end of the shell portion and disposed below the core structure,
   wherein an upper boundary of the first phase change material layer contacts the end portion of the second conductive column.

2. The memory device of claim 1, further comprising:
   a bottom electrode disposed below the first dielectric layer, and coupled to the end portion of the first conductive column.

3. The memory device of claim 1, further comprising:
   a top electrode disposed above the second dielectric layer, and coupled to the other end of the shell portion of the second conductive column.

4. The memory device of claim 1, wherein the shell portion of the first conductive column structure has a cross-sectional area of about 1 to 10 nanometers.

5. The memory device of claim 1, wherein the shell portion of the first conductive column structure comprises an inner boundary and an outer boundary that each form a circumference of a circular shape when viewed from top.

6. The memory device of claim 1, wherein the shell portion of the first conductive column structure comprises an inner boundary and an outer boundary that each form a circumference of a polygonal shape when viewed from top.

7. The memory device of claim 1, further comprising:
   a second phase change material layer formed over the first dielectric layer,
   wherein a lower boundary of the second change material layer contacts at least a second portion of the other end of the shell portion of the first conductive column.

8. The memory device of claim 7, wherein at least one of the first and second phase change material layers has a circular shape, a polygonal shape, or a circumferential shape when viewed from top.

9. A memory device, comprising:
   a bottom electrode formed in a first dielectric layer;
   a phase change material layer formed in a second dielectric layer; and
   a heater structure formed in a third dielectric layer and extending entirely through the third dielectric layer between the bottom electrode and the phase change material layer, wherein the heater structure lines a trench thereby causing a first portion of the heater structure to contact the phase change material layer at a first end and wrap a dielectric material directly disposed below the phase change material layer,
   wherein the heater structure further comprises a second portion coupled to a second end of the first portion and disposed below the wrapped dielectric material, the second end being opposite the first end, and
   wherein the first portion of the heater structure comprises an inner boundary and an outer boundary that each form a circumference of a circular shape when viewed from top.

10. The memory device of claim 9, wherein the heater structure is formed of a conductive material selected from at least one of: TaN, TiN, TiAlN, and TiW.

11. The memory device of claim 9, wherein the first portion of the heater structure has a cross-sectional area of about 1 to 10 nanometers.

12. The memory device of claim 9, further comprising:
    a top electrode disposed above and coupled to the phase change material layer.

13. The memory device of claim 9, wherein the first portion of the heater structure comprises an inner boundary and an outer boundary that each form a circumference of a polygonal shape when viewed from top.

14. The memory device of claim 9, wherein the phase change material layers has a circular shape, a polygonal shape, or a circumferential shape when viewed from top.

15. A memory device, comprising:
    a first conductive column structure extending entirely through a first dielectric layer, wherein the first conductive column structure comprises a shell portion wrapping a core structure filled with a dielectric material and an end portion that is coupled to a first end of the shell portion and disposed below the core structure, wherein the shell portion comprises a conductive layer;
    a first phase change material layer formed over the first dielectric layer, wherein a lower boundary of the first phase change material layer contacts at least a first portion of a second end of the shell portion, the second end being opposite the first end;
    a second dielectric layer disposed above the first phase change material layer; and
    a second conductive column structure extending through the second dielectric layer, wherein the second conductive column structure comprises a shell portion wrapping a core structure filled with a dielectric material and an end portion that is coupled to one end of the shell portion and disposed below the core structure, wherein an upper boundary of the first phase change material layer contacts the end portion of the second conductive column.

16. The memory device of claim 15, further comprising:
a bottom electrode disposed below the first dielectric layer, and coupled to the end portion of the first conductive column.

17. The memory device of claim 15, further comprising:
a top electrode disposed above the second dielectric layer, and coupled to the other end of the shell portion of the second conductive column.

* * * * *